United States Patent
Eckardt

[11] Patent Number: 6,034,521
[45] Date of Patent: Mar. 7, 2000

[54] ACTIVE OPTICAL CURRENT MEASURING SYSTEM

[75] Inventor: Dieter Eckardt, Herzogenaurach, Germany

[73] Assignee: Siemens Aktiengesellschaft, Munich, Germany

[21] Appl. No.: 08/913,738

[22] PCT Filed: Feb. 29, 1996

[86] PCT No.: PCT/DE96/00358

§ 371 Date: Dec. 18, 1997

§ 102(e) Date: Dec. 18, 1997

[87] PCT Pub. No.: WO96/29608

PCT Pub. Date: Sep. 26, 1996

[30] Foreign Application Priority Data

Mar. 23, 1995 [DE] Germany .......................... 195 10 662

[51] Int. Cl.[7] .............................. G01R 1/44; G01R 15/14; G01R 15/22
[52] U.S. Cl. .............................................. 324/96; 324/126
[58] Field of Search .............................. 324/96, 126, 127, 324/117 R

[56] References Cited

U.S. PATENT DOCUMENTS 4,070,572  1/1978  Summerhayes .
5,461,307  10/1995  Berkcan .

FOREIGN PATENT DOCUMENTS

WO 92/13277  8/1992  WIPO .

OTHER PUBLICATIONS

M. Adolfsson et al. "EHV Series Capacitor Banks. A New Approach To Platform To Ground Signalling, Relay Protection And Supervision", IEEE transactions On Power Delivery, vol. 4, No. 2 (Apr. 1989).

Harald Schwarz et al. "Optische Strom–wandler–erster Feldversuch im 380–kV–Netz Erfolgreich", ABB–Technik, Bd. 3, pp. 12–18 (1994). ** (No Translation).

Dieiter Eckardt "Combined Insulated Current And Voltage Measurement System For Use In High Power Converters" Siemens AG, Drives and Standard Products (Mar. 11, 1997).

*Primary Examiner*—Walter E. Snow
*Attorney, Agent, or Firm*—Kenyon & Kenyon

[57] ABSTRACT

An active optical current-measuring system (2) including a sensor (4) which is provided with current connecting busbars (12, 14) and a light guide connector. The sensor includes two parts (8, 10) which, when assembled, form a hollow cavity (16) within which an electronic sensor component (6) is mounted. The electronic sensor is connected at the output to the light guide connector. A measuring resistor is provided as the sensor (4). The current-measuring system (2) is also capable of detecting direct currents. The electronic sensor component,(6) is mechanically protected and electromagnetically shielded.

18 Claims, 3 Drawing Sheets

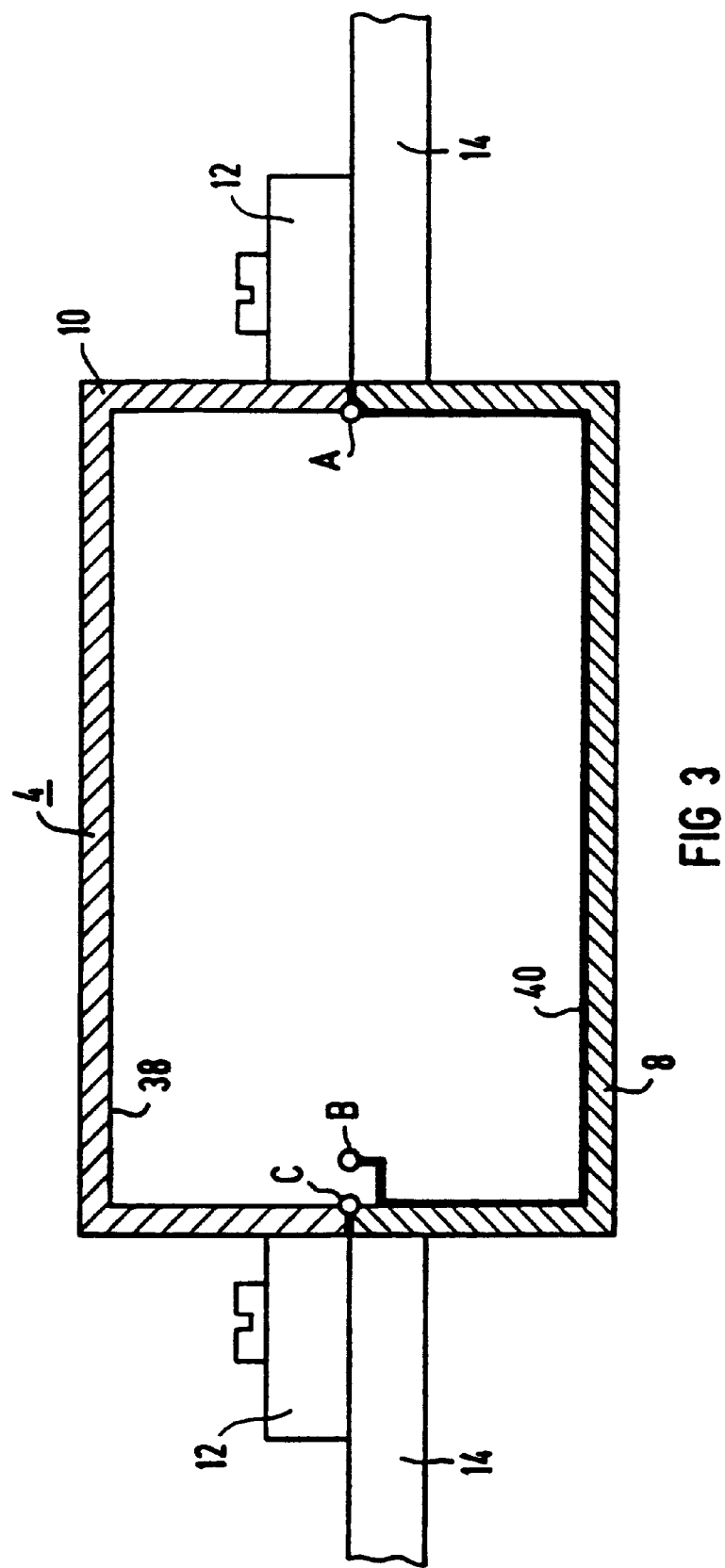

ACTIVE OPTICAL CURRENT MEASURING SYSTEM

FIELD OF THE INVENTION

The present invention relates to an active optical current measuring system.

BACKGROUND INVENTION

The intermediate circuit voltages in large-scale power converters have already reached approximately 5 kV today and tend toward 10 kV and 20 kV. Such high intermediate circuit voltages also make high demands of the insulation resistance of the current and voltage transformers. The partial discharge strength is the most important design parameter for the insulation resistance. At an intermediate circuit voltage of 5 kV, a partial discharge strength of 20 kV must be required.

The transformer systems in use today are compensating current transformers. To maintain the required partial discharge strength, however, these transformers must be manufactured in accordance with techniques that greatly increase the cost of the transformers. Furthermore, these transformers take up a great deal of space, and the lines that provide power to the transformer and that transmit measurement signals must be installed in compliance with specifications for the clearance in air and the creepage distance to guarantee reliable isolation. This further increases the amount of space required.

Since transformers can hardly guarantee a partial discharge strength of 20 kV at an intermediate circuit voltage of 5 kV, increasingly expensive insulation is not a suitable way to make, at a relatively inexpensive cost, a strong transformer system suitable for even higher intermediate circuit voltages.

A fundamentally different approach toward solving this problem is to achieve reliable isolation by means of light guides. However, this means that an electronic component connected to the sensor is needed to amplify at least the measurement signals supplied by the sensor and to control a light guide transmitter. However, the power supply to this electronic component must then also be transmitted over a light guide. Such power transmission systems comprise a laser, a light guide, and a power converter. However, the transmissible power is limited to a few hundred milliwatts. For this reason, no compensating current transformer can be used in systems that are supplied with light energy because the power demand by these transformers is too great due to the compensating current.

The article "Optical Current Transformer—Successful First Field Trial In A 380 kV Network", printed in the German journal ABB Technik, vol. 3 (1994) pages 12 through 18, discusses an active optical current measuring system. This article presents various optical current transformers that have been tested in a German 380 kV network under actual conditions. The active current transformer functions essentially according to the conventional current measurement principle, supplemented by a digital optical transmission link. Specifically, the system comprises an air-core inductor, including load impedance, an analog-digital converter, and a transmitter unit with a light-emitting diode at a high potential. A light guide establishes the connection to the interface device at ground potential. The electronic component that is at a high voltage potential has a power demand of less than 150 $\mu$W. This electronic component is designed as a low-power, CMOS integrated component. A laser diode that transmits power between two data telegrams over the same light guide is sufficient as the power supply. At greater distances between the sensor and the interface device, a parallel light guide is needed for the power supply because of the higher transmitting power.

The article "EHV Series Capacitor Banks. A New Approach To Platform To Ground Signaling, Relay Protection And Supervision," published in the journal *IEEE Transactions on Power Delivery*, vol. 4, no. 2 (April 1989) pages 1369 through 1378, describes the use of an active current transformer with a series compensator. This article describes the design of an active current transformer, an electronic sensor component and an interface device at ground potential. The electronic sensor component comprises a filter, a plurality of voltage dividers, and an energy converter. The interface device comprises a receiver, a limit value circuit, a detector, a buffer, a pulse generator, a transmitter, and a light filter. Since the active current transformer uses an air-core inductor with a load impedance for the current measurement, only alternating currents can be detected with this active current transformer.

A measuring resistor or shunt is a current sensor that can also detect direct currents and does not need a separate power supply. Since the measurement signals of the shunt must be kept low in the interest of keeping the power loss low, an electronic sensor should be located in the immediate vicinity of the shunt to prevent most interference. This electronic component is then operated in a rough electromagnetic environment, i.e., it is exposed to strong and often quickly changing electric and magnetic fields. In addition, the electronic component is usually exposed to relatively high temperatures. One disadvantage of the measuring resistor is that it must be machined for an adjustment.

SUMMARY OF THE INVENTION

An object of the present invention is to provide an active optical current measuring system with which direct currents can be measured and which comprises an electronic sensor component which is protected from interference.

The sensor of the system of the present invention comprises two parts which, when assembled, form a hollow cavity in which the electronic sensor is mounted. A measuring resistor (shunt) is provided as the sensor and forms the casing for the electronic sensor component. Since the shunt acts as an electromagnetic shield, this design guarantees mechanical protection of the electronic component and prevents high-frequency interference from acting on the electronic component. The actual sensor signals are picked up on the inside of the shunt.

In an embodiment of the active optical current measuring system of the present invention, the electronic sensor component is linked on the inside at the input to two measuring points that are close together spatially, with the first measuring point being a point on the inside of the sensor, and the second measuring point being connected to another point on the inside of the sensor by an insulated line running along the inside of the sensor. This additional point is selected so that the second measuring point and this additional measuring point are separated spatially by a relatively great distance. By means of this insulated line, the potential applied to the additional point is transmitted to the second measuring point with a low inductance at the shunt. In this way, the resulting measuring-circuit voltage is always exactly the voltage corresponding to the voltage drop caused by the current on the closed conductor loop along the path of the measuring line.

In another embodiment, the second measuring point is connected to the additional point on the inside of the sensor by means of several insulated lines running along the inside of the sensor, which forms a cage. With this design of the multiple measuring lines forming a cage, immunity with respect to external interference fields is greatly increased.

In another embodiment, the electronic sensor component has electronically controlled potentiometers. This permits electronic adjustment of offset and gain. Therefore, the shunt can be manufactured first, then the electronic component inserted and the current-measuring system adjusted without machining. The respective loop positions of the electronically controlled potentiometers are stored. When the active optical current-measuring system is switched on, the stored position is automatically read out again and the potentiometers are adjusted.

This current measuring system is adjusted with regard to the zero point and gain or transfer coefficient. Transmission of the signals for adjusting the electronically controlled potentiometers can be accomplished over a plug-and-socket connection provided on a shunt and also by the fact that the light sent by the transmitter of the electronic analyzer at ground potential is modulated and the information is recovered at the electronic sensor. The adjustment can be performed fully automatically.

BRIEF DESCRIPTION OF THE DRAWINGS

FIG. 3 illustrates a shunt for determining a sensor signal.

DETAILED DESCRIPTION

Figure 1:
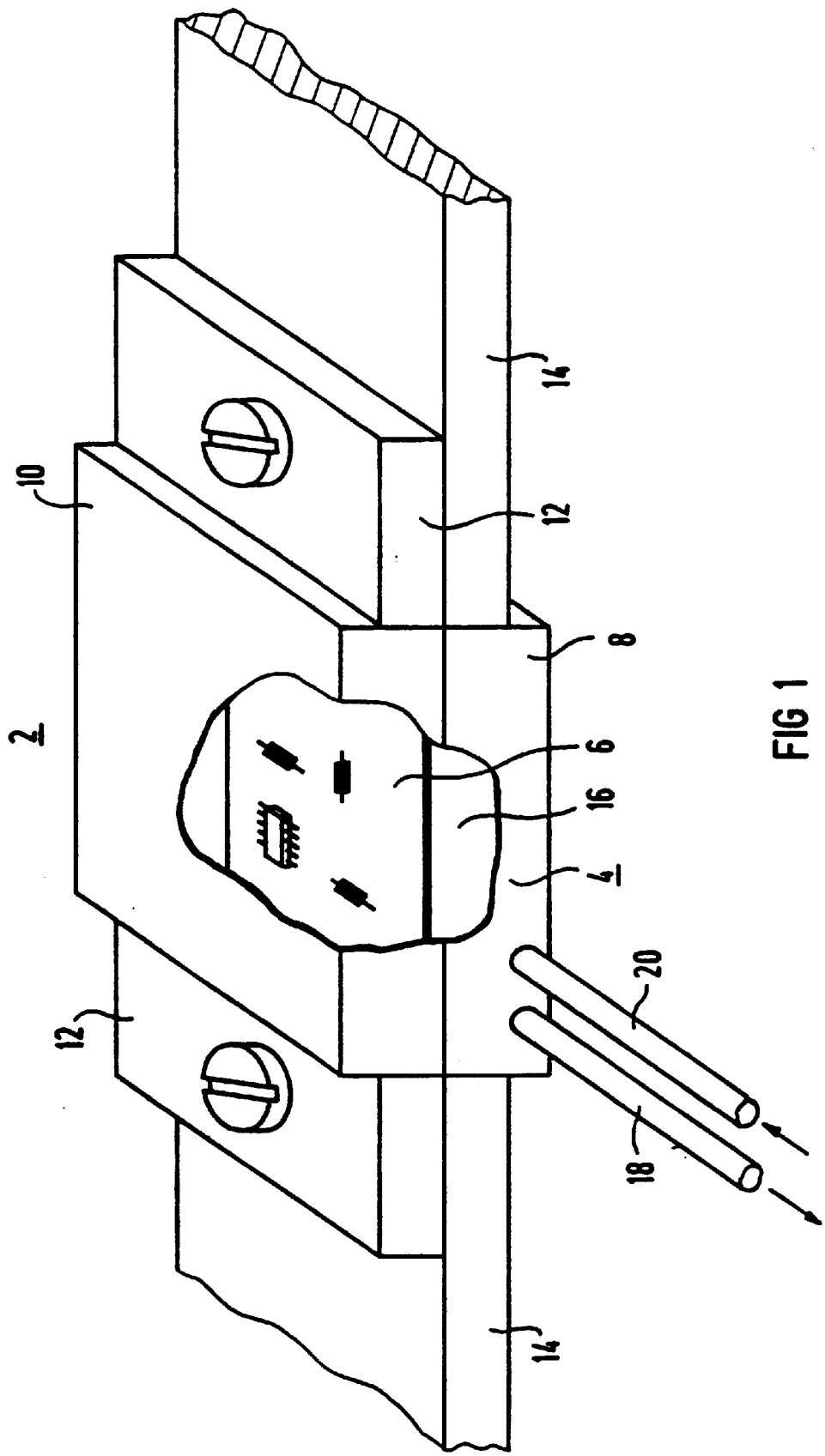
FIG. 1 shows the structural design of a current measuring system according to the present invention.

FIG. 1 shows the physical design of an active optical current measuring system 2 according to the present invention. The system includes a sensor 4 and an electronic sensor component 6. Sensor 4 is a measuring resistor (shunt) that consists of parts 8 and 10. Each lateral side of parts 8 and 10 is provided with a current connecting busbar 12 and 14. In addition, the shunt parts 8 and 10 are designed so that when assembled, shunt 4 has a hollow space 16.

Electronic sensor component 6 is arranged in the hollow space 16. Shunt 4 practically forms the casing for electronic sensor component 6, which is illustrated in further detail in FIG. 2. The two parts 8 and 10 of shunt 4 may be made of manganin, whereas current connecting busbars 12 and 14 may be made of copper. Current connecting busbars 12 and 14 may be hard soldered, for example, to parts 10 and 8, respectively. These current connecting busbars 12 and 14 provide the connection for the two shunt parts 8 and 10 on the one hand and on the other hand they provide for the mounting in a busbar, e.g., a busbar in an intermediate circuit of a large-scale power converter. To connect the two shunt parts 8 and 10, current connecting busbars 12 and 14 are screwed, riveted, or welded together. Sensor 4 is also provided with two light guide connectors (not shown in this diagram). The two light guides 18 and 20 are plugged into the light guide connectors, with light guide 18 being responsible for transmission of the data stream or the complex signal consisting of a PWM signal and a data signal, and light guide 20 being responsible for transmission of the power for electronic sensor component 6. This design of the active optical current measuring system provides mechanical protection of electronic sensor component 6 and prevents high-frequency interference from influencing electronic sensor component 6. This protection is due to shunt 4 acting as an electromagnetic shield.

Figure 2:
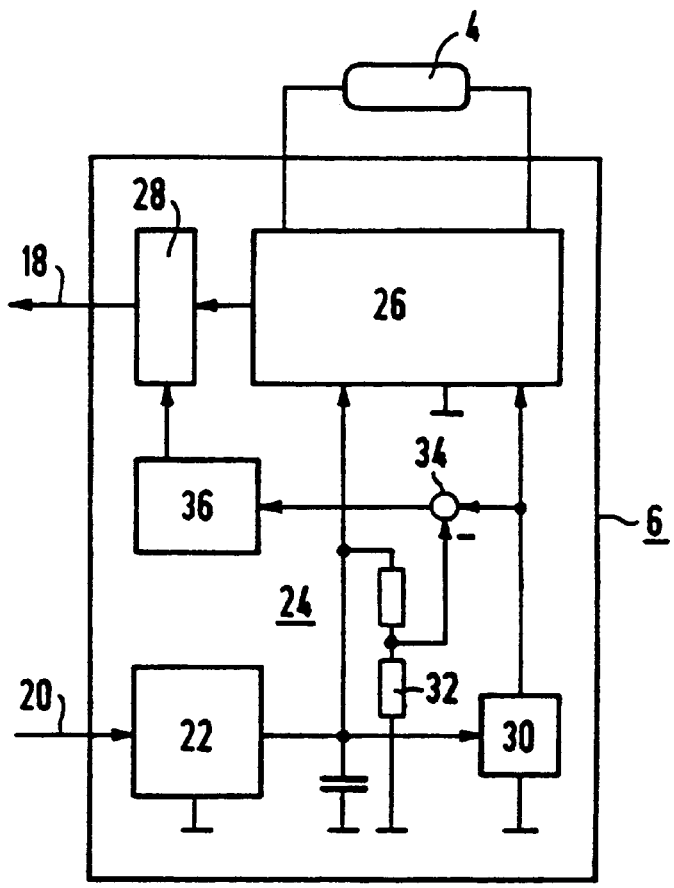
FIG. 2 shows a block schematic diagram of an electronic sensor component of the current measuring system according to FIG. 1.

FIG. 2 shows a block schematic diagram of electronic sensor component 6. The electronic sensor component 6 comprises an energy converter 22, a measurement unit 24, an electronic processing component 26, and a digital mixing unit 28. Measurement unit 24, which serves to regulate the power supply voltage of electronic processing component 26, has a reference value generator 30, a voltage divider 32, a comparator 34, and a pulse-width modulator (PWM) 36. Power in the form of laser light travels over light guide 20 to energy converter 22, which converts this light back into electricity. The voltage built up by energy converter 22 serves directly, i.e., without additional in situ voltage regulation, to supply current to electronic processing component 26, which is linked at the input to sensor 4.

In order to make it possible nevertheless to keep the power supply voltage of electronic processing component 26 constant, this voltage is measured and compared with a reference voltage. The difference is pulse width modulated and transmitted to the electronic analyzer of the interface module at ground potential together with the data stream supplied by electronic processing component 26 with the help of mixing unit 28, in particular a multiplexer. The actual measuring signal and the PWM signal are separated at this point as well. While the measuring signal is routed to a processor, the PWM signal is sent as the input signal to a controller that varies the power of the transmitter in such a way that the voltage built up by energy converter 22 is kept constant.

The actual sensor signals are picked up on the inside 38 of shunt 4. Because of the mechanical design of shunt 4, the voltage drop across shunt 4 can always be picked off only between two points A and C which are separated by a relatively great distance (FIG. 3). To be able to process the measuring-circuit voltage in an electronic component 6 (not shown in detail in this figure for the sake of simplicity), the measuring-circuit voltage must, however, be sent to an amplifier having terminals generally located in close proximity to one another. Thus, the measuring-circuit voltage must be carried over a line 40. The line 40 is laid close to the inside 38 of shunt 4 and is insulated. The line 40 serves to transmit the potential existing at point A to point B with a low inductance on the shunt. Measuring point B is located in close proximity to measuring point C. The actual sensor signal can be picked up between the points B and C and provided to electronic sensor component 6.

In order to prevent interference, it is necessary to ensure that no open conductor loop exists between the closed conductor loop (inside 38 of shunt 4) and measuring line 40. This condition can be met only by a closed measuring conductor loop that is practically identical to the first conductor loop, but is insulated from it. The two conductor loops are connected to each other only at point A. However, this interference compensation is linked to a condition, because an interference field permeating the external conductor loop and inducing a current in it also penetrates through the measuring conductor loop and likewise induces a leakage current in this conductor loop. Complete compensation of the external interference field results only when the ratio of the partial resistances of the conductor loop and the measuring conductor loop is the same. Only in this case are the voltage drops caused by the induced currents in the external conductor loop (inside 38 of the shunt) and the measuring conductor loop the same and cancel out each other.

Figure 4:
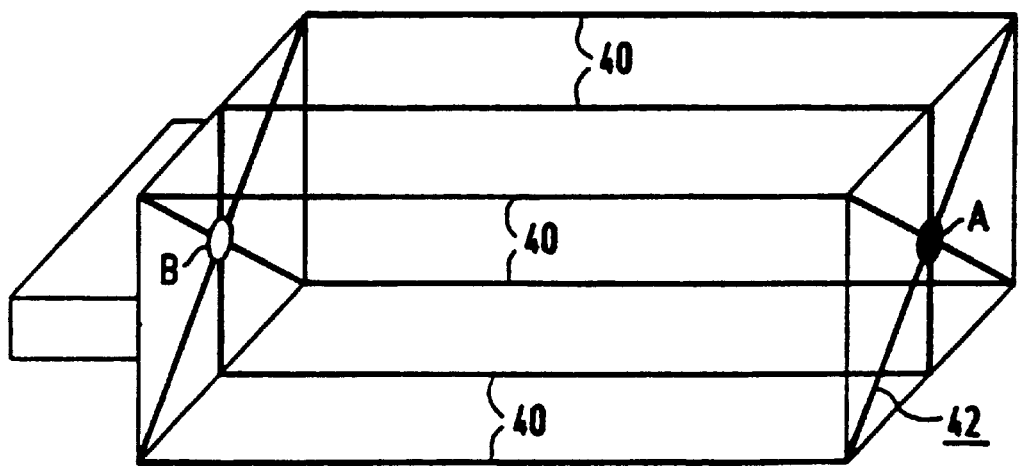
FIG. 4 illustrates a compensating cage.

To obtain a measuring conductor loop, another measuring line 40 must be provided, that is connected to the first measuring line 40 at point A and to shunt 4 and the first measuring line 40 at point B (FIG. 4). Since shunt 4 is three-dimensional, the interference fields can act on shunt 4 in any direction and induce corresponding eddy currents. Therefore, the measuring conductor loop must also have a three-dimensional design. Here it assumes the form of a cage 42 according to FIG. 4 which conforms to the inside 38 of the shunt, but is insulated from it. In the ideal case, cage 42 forms a closed casing. With a symmetrical cage 42 consisting of only six individual conductors 40, interference compensation of approximately 90% in comparison with a single conductor loop is achieved. As FIG. 4 indicates, individual conductors 40 of cage 42 run in the direction of the external current flow. This does not permit compensation of any eddy currents across the direction of current flow, but they do not in a first approximation contribute to a falsification of the measuring-circuit voltage of shunt 4.

Electronic processing component 26, which comprises an amplifier circuit at the input and an analog-digital converter at the output, is designed to permit electronic offset and gain adjustment. Thus, shunt 4 can be manufactured first, after which electronic sensor component 6 can be inserted and active optical current-measuring system 2 can be adjusted without machining. For electronic adjustment of current-measuring system 2, electronically controlled potentiometers are provided in the amplifier circuit of electronic processing component 26. The respective loop position is stored at the end of the adjustment. When the device is switched on, the stored loop position is automatically read out again and the potentiometer is adjusted. The signals for adjusting the potentiometers can be transmitted over a plug-and-socket connection provided on the shunt or by the fact that the light received by energy converter 22 is modulated and the information is recovered in electronic sensor component 6. The adjustment can be made fully automatically.

What is claimed is:

1. An active optical current-measuring system, comprising:

a first busbar;

a second busbar;

at least one light guide connector;

a sensor coupled to the first busbar, the second busbar, and the at least one light guide connector, wherein the sensor comprises a first sensor part and a second sensor part, the first sensor part and the second sensor part forming a hollow cavity in the sensor; and an electronic sensor component mounted within the hollow cavity, the electronic sensor component having an output coupled to the at least one light guide connector.

2. The active optical current measuring system according to claim 1, wherein the sensor comprises a measuring resistor.

3. The active optical current measuring system according to claim 1, wherein:

the electronic sensor component has an input connected to a first measuring point and to a second measuring point, the first measuring point being located proximate to the second measuring point, a measuring-circuit voltage is picked up at the first measuring point and the second measuring point, the first measuring point is located on an inside portion of the sensor, the second measuring point is coupled to an additional point on the inside portion of the sensor by an insulated line running along the inside portion of the sensor, and the second measuring point and the additional point are located on substantially opposite ends of the sensor.

4. The active optical current measuring system according to claim 3, wherein the second measuring point is connected to the additional point on the inside portion of the sensor by a plurality of insulated lines running along the inside portion of the sensor.

5. The active optical current measuring system according to claim 4, wherein the plurality of insulated lines runs in a direction of a sensor current, and wherein the plurality of insulated lines forms a cage.

6. The active optical current measuring system according to claim 5, wherein the cage forms a closed casing.

7. The active optical current measuring system according to claim 1, wherein the electronic sensor component includes a plurality of electronically controlled potentiometers.

8. The active optical current measuring system according to claim 1, wherein each one of the first sensor part and the second sensor part is coupled to at least one of the first busbar and the second busbar.

9. The active optical current measuring system according to claim 1, wherein the sensor comprises manganin.

10. The active optical current measuring system according to claim 1, wherein each one of the first busbar and the second busbar comprises copper.

11. The active optical measuring system according to claim 1, comprising at least two light guide connectors.

12. The active optical current measuring system according to claim 1, wherein the sensor forms an electromagnetic shield for the electronic sensor component.

13. The active optical current measuring system according to claim 1, wherein the sensor mechanically protects the electronic sensor component.

14. The active optical current measuring system according to claim 1, wherein the electronic sensor component includes a measurement unit.

15. The active optical current measuring system according to claim 1, wherein the electronic sensor component includes an energy converter.

16. The active optical current measuring system according to claim 1, wherein the electronic sensor component includes an electronic processor component.

17. The active optical current measuring system according to claim 1, wherein the electronic sensor component includes a pulse-width modulator.

18. The active optical current measuring system according to claim 1, wherein the electronic sensor component includes an electro-optical system.

* * * * *